US006956395B2

(12) United States Patent
Oshima et al.

(10) Patent No.: US 6,956,395 B2
(45) Date of Patent: Oct. 18, 2005

(54) TESTER FOR TESTING AN ELECTRONIC DEVICE USING OSCILLATOR AND FREQUENCY DIVIDER

(75) Inventors: Hideyuki Oshima, Tokyo (JP); Yasutaka Tsuruki, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/889,379

(22) Filed: Jul. 12, 2004

(65) Prior Publication Data

US 2004/0239310 A1 Dec. 2, 2004

Related U.S. Application Data

(63) Continuation of application No. PCT/JP03/000337, filed on Jan. 17, 2003.

(30) Foreign Application Priority Data

Jan. 18, 2002 (JP) ........................................ 2002-010877

(51) Int. Cl.[7] ........................ G01R 31/26; G01R 31/28
(52) U.S. Cl. .................. 324/765; 324/73.1; 324/158.1; 714/724
(58) Field of Search ............................. 324/158.1, 73.1, 324/765, 537, 601, 76.19–22; 714/724, 736, 744; 365/189.09, 201

(56) References Cited

U.S. PATENT DOCUMENTS

| 5,703,489 | A | * | 12/1997 | Kuroe ........................ 324/601 |
| 5,710,744 | A | | 1/1998 | Suda |
| 6,255,839 | B1 | * | 7/2001 | Hashimoto ................... 324/75 |
| 6,404,220 | B1 | * | 6/2002 | Hashimoto ................... 324/765 |
| 2001/0028243 | A1 | | 10/2001 | Niratsuka |

FOREIGN PATENT DOCUMENTS

JP  2-32078  2/1990

OTHER PUBLICATIONS

NN81081677 "Combined multi corner testing with time and or voltage modulation" Aug. 1981, US. IBM technical disclosure bulletin, vol. 24, Issue No. 3, p. No. 1677–1679.*
NN960971 "Mehanism for scan–based test application at high–speed" Sep. 1996, US. IBM technical disclosure bulletin, vol. 39, Issue No. 9, p. No. 71–78.*
NA8911400 "Performance monotoring of VLSI devices" Nov. 1989, US. IBM technical disclosure bulletin, vol. 32, Issue No. 6A, p. No. 400–404.*
International Search Report dated Apr. 30, 2003 (3 pgs.).
Patent Abstracts of Japan, Publication No. 11–014714 dated Jan. 22, 1999, 1 pg.
Patent Abstracts of Japan, Publication No. 2001–201533 dated Jul. 27, 2001, 1 pg.
Patent Abstracts of Japan, Publication No. 2000–221248 dated Aug. 11, 2000, 1 pg.
Patent Abstracts of Japan, Publication No. 09–026467 dated Jan. 28, 1997, 1 pg.

(Continued)

Primary Examiner—Paresh Patel
(74) Attorney, Agent, or Firm—Osha Liang LLP

(57) ABSTRACT

A tester comprising a reference clock generating section for generating a reference clock having a first frequency, a first test rate generating section for generating a first test rate clock having a frequency which is about an integral multiple of the first frequency, a second test rate generating section for generating a second test rate clock having a frequency which is about an integral multiple of the first frequency and different from the frequency of the first test rate clock, a first driver section for supplying a test pattern to an electronic device according to the first test rate clock, and a second deriver section for supplying the test pattern to the electronic device according to the second test rate clock.

12 Claims, 11 Drawing Sheets

OTHER PUBLICATIONS

Patent Abstracts of Japan, Publication No. 03-195978 dated Aug. 27, 1991, 1 pg.

Patent Abstracts of Japan, Publication No. 2001-244923 dated Sep. 7, 2001, 1 pg.

* cited by examiner

TESTER FOR TESTING AN ELECTRONIC DEVICE USING OSCILLATOR AND FREQUENCY DIVIDER

The present application is a continuation application of PCT/JP03/000337 filed on Jan. 17, 2003 which claims the benefit of, and priority from, Japanese patent application No. 2002-10877 filed on Jan. 18, 2002, the entire contents of which are incorporated herein by reference for all purposes.

FIELD OF THE INVENTION

The present invention relates to a tester for testing an electronic device. More particularly, the present invention relates to a tester for testing an electronic device with a plurality of cores whose operating frequencies are different.

RELATED ART

A conventional tester for testing an electronic device such as a semiconductor device supplies a test pattern whose frequency corresponds to the operating frequency of the electronic device so as to perform the test of the electronic device. If the electronic device has a plurality of cores whose operating frequencies are different, the tester sequentially tests each of the cores. For example, if the electronic device has a CPU and a decoder whose operating frequencies are different, the tester sequentially supplies test patterns whose frequencies correspond to the operating frequencies respectively to the CPU and the decoder.

In order to minutely perform the test of the electronic device, however, it is necessary to make the plurality of cores operate at the same time during the test. The conventional tester generates a plurality of clocks corresponding to the operating frequencies of the plurality of cores respectively and supplies the test patterns, which correspond to the cores respectively, to the cores of the electronic device respectively based on the plurality of clocks generated. In the conventional tester, however, it is difficult to perform the test with reproducibility because the plurality of clocks are not synchronized. For example, whenever the test starts, there is no reproducibility in the phase relation of the plurality of test patterns, and it is difficult to perform the test with reproducibility.

SUMMARY OF THE INVENTION

Accordingly, it is one of objects of the present invention to provide a tester, which is capable of overcoming the above drawbacks accompanying the conventional art. The above and other objects can be achieved by combinations described in the independent claims. The dependent claims define further advantageous and exemplary combinations of the present invention.

In order to solve the foregoing problems, according to the first aspect of the present invention, a tester for testing an electronic device includes a reference clock generating section for generating a reference clock of a first frequency, a first test rate generating section for generating a first test rate clock, whose frequency is a substantially integral multiple of the first frequency, based on the reference clock, a second test rate generating section for generating a second test rate clock, whose frequency is a substantially integral multiple of the first frequency and different from the frequency of the first test rate clock, based on the reference clock, a first driver section for supplying the electronic device with a first test pattern of a second frequency to test the electronic device according to the first test rate clock, and a second driver section for supplying the electronic device with a second test pattern of a third frequency to test the electronic device according to the second test rate clock.

The first and second driver sections may start to supply the electronic device with the first and second test patterns, synchronizing the first and second test patterns at desired timing. Each of first and second driver sections may supply the electronic device with the first or second corresponding test pattern at a frequency substantially the same as the frequency of the first or second test rate clock.

The reference clock generating section may generate the reference clock whose period is substantially the same as a least common multiple of periods of the first and second test rate clocks to be generated by the first and second test rate generating sections. The tester may further include a pattern start signal generating section for generating a pattern start signal which indicates the desired timing, wherein the first and second driver sections may start to supply the first and second test patterns based on the pattern start signal.

Each of the first and second test rate generating sections may include an oscillator section for receiving the reference clock and generating an oscillation clock whose frequency is substantially integral multiple of the frequency of the reference clock, a first frequency divider for dividing the frequency of the oscillation clock and generating the first or second test rate clock, and a second frequency divider for dividing the frequency of the first or second test rate clock and generating a verifying clock whose frequency is substantially the same as the frequency of the reference clock, wherein each of the oscillator sections may synchronize a phase of each of the oscillation clocks based on a phase of each of the verifying clocks and a phase of the reference clock.

Each of the first and second test rate generating sections may further include a frequency division control section for controlling a ratio of frequency division of the first corresponding frequency divider, and each of the frequency division control sections may control the ratio of frequency division of the first corresponding frequency divider based on the frequency of the first or second test rate clock to be generated by the first or second corresponding test rate generating section and the frequency of the corresponding oscillation clock. The tester may further include a storage section for correspondingly storing the frequency of the first or second test rate clock to be generated by the first or second test rate generating section, the frequency of the oscillation clock, and the ratio of frequency division of the first frequency divider to be controlled by the first frequency division control section.

Each of the first and second test rate generating sections may further include a switching section for switching whether to supply the first or second corresponding driver section with the first or second corresponding test rate clock based on the reference clock and pattern start signal. The switching section may supply the first or second corresponding driver section with the first or second corresponding test rate clock, if each of the reference clock and pattern start signal indicates a predetermined value.

Each of the first and second driver sections may include a coarse delay section for generating a timing signal, which results from delaying each of pulses of the first or second corresponding test rate clock as much as a desired integral multiple of a period of a corresponding oscillation clock, a pattern generator for generating the first or second corresponding test pattern according to the timing signal, and a fine delay section for delaying the corresponding first or second test pattern for predetermined time intervals and supplying the test pattern to the electronic device.

The reference clock generating section may include a variable oscillator section for generating a variable frequency clock with a variable octave frequency range and a third frequency divider for dividing a frequency of the variable frequency clock at a desired ratio of frequency division and generating the reference clock of a desired frequency.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
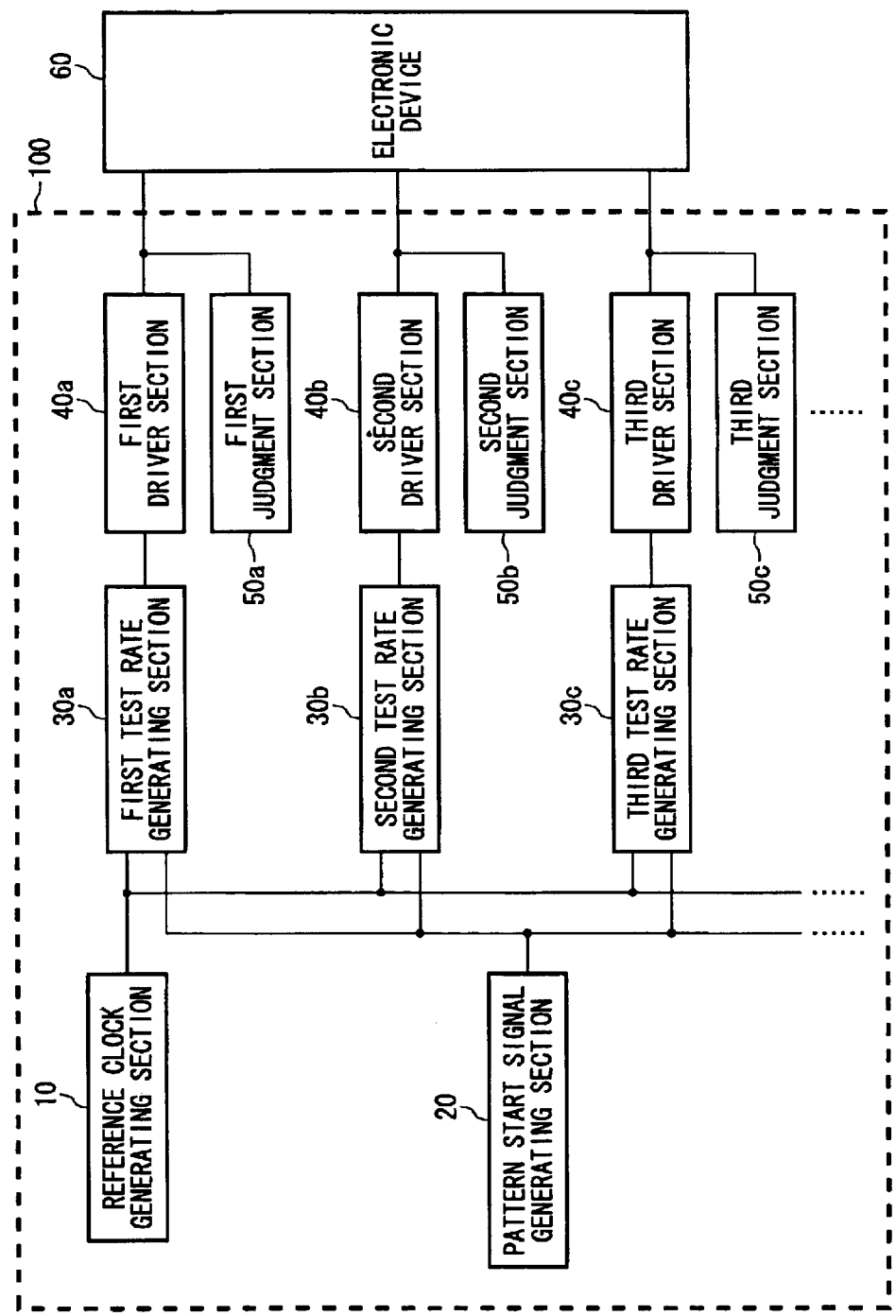
FIG. 1 shows an example of the configuration of a tester 100 according to this invention.

FIG. 1 shows an example of the configuration of a tester 100 according to this invention. The tester 100 tests an electronic device 60. The electronic device 60 has a plurality of cores whose operating frequencies are different. The tester 100 is provided with a reference clock generating section 10, a pattern start signal generating section 20, a plurality of test rate generating sections 30, a plurality of driver sections 40, and a plurality of judgment sections 50.

The reference clock generating section 10 generates a reference clock of a first frequency. It is preferable that the reference clock generating section 10 generates a reference clock whose period is approximately the same as the least common multiple of the periods of a plurality of test rate clocks to be generated by the test rate generating sections 30. A first test rate generating section 30a among the plurality of test rate generating sections 30 generates a first test rate clock whose frequency is an approximately integral multiple of the first frequency based on the reference clock. And a second test rate generating section 30b generates a second test rate clock, whose frequency is an approximately integral multiple of the first frequency and different from the frequency of the first test rate clock, based on the reference clock. And a third test rate generating section 30c generates a third test rate clock, whose frequency is an approximately integral multiple of the first frequency and different from the frequencies of the first and second test rate clocks, based on the reference clock.

And although the first, second and third test rate generating sections 30a, 30b and 30c generate their test rate clocks whose frequencies are different from each other in this embodiment, alternatively, one or more of test rate generating section(s) 30 may generate test rate clocks whose frequencies are approximately the same as the frequencies of the test rate clocks generated by other test rate generating sections 30. Each of the test rate generating sections 30 generates its test rate clock in accordance with the operating frequency of the corresponding core of the electronic device.

A first driver section 40a among the plurality of driver sections 40 supplies the electronic device 60 with a first test pattern of a second frequency to test the electronic device 60 in response to the first test rate clock. And a second driver section 40b among the plurality of driver sections 40 supplies the electronic device 60 with a second test pattern of a third frequency to test the electronic device 60 in response to the second test rate clock. And a third driver section 40c among the plurality of driver sections 40 supplies the electronic device 60 with a third test pattern of a fourth frequency to test the electronic device 60 in response to the second test rate clock.

And each of the first, second and third driver sections 40a, 40b and 40c may supply the electronic device 60 with the first, second or third corresponding test pattern with the frequency approximately the same as the frequency of the first, second or third corresponding test rate clock. In other words, the plurality of driver sections 40 may supply the corresponding cores of the electronic device 60 with the test patterns whose frequencies are approximately the same as the frequencies of the test rate clocks received. For example, the plurality of driver sections 40 may supply the corresponding cor+es of the electronic device with pulses included in the test patterns according to the pulses of the test rate clocks received.

The plurality of judgment sections 50 judge the quality of the corresponding cores of the electronic device 60 based on the output signals respectively outputted by the cores of the electronic device 60 in response to the corresponding test patterns. The plurality of judgment sections 50 may judge the quality of the corresponding cores of the electronic device 60 based on the expected signals to be respectively outputted by the cores of the electronic device 60 and the output signals respectively outputted by the cores of the electronic device 60. In this case, each of the plurality of driver sections 40 may generate the expected signal to be outputted by the corresponding core of the electronic device 60 based on the corresponding test pattern and supply it to the corresponding judgment section 50.

According to the tester 100 related to this embodiment, since the plurality of test rate clocks are generated from the reference clock and the test patterns are supplied to the electronic device 60 based on the test rate clocks, it is possible to test the plurality of cores of the electronic device 60 with the synchronized test patterns. Therefore, it is possible to perform the test of the electronic device 60 with high precision.

And the plurality of driver sections 40 preferably synchronize the phases of the test patterns with desired timing and start to supply the plurality of test patterns to the electronic device 60. In this embodiment, the pattern start signal generating section 20 generates a pattern start signal which indicates the desired timing. The plurality of driver sections 40 start to supply the plurality of test patterns based on the pattern start signal. According to the tester 100 of this embodiment, the plurality of test patterns start to be supplied when their phases are synchronized with the desired timing, it is possible to perform the test with reproducibility.

Figure 2:
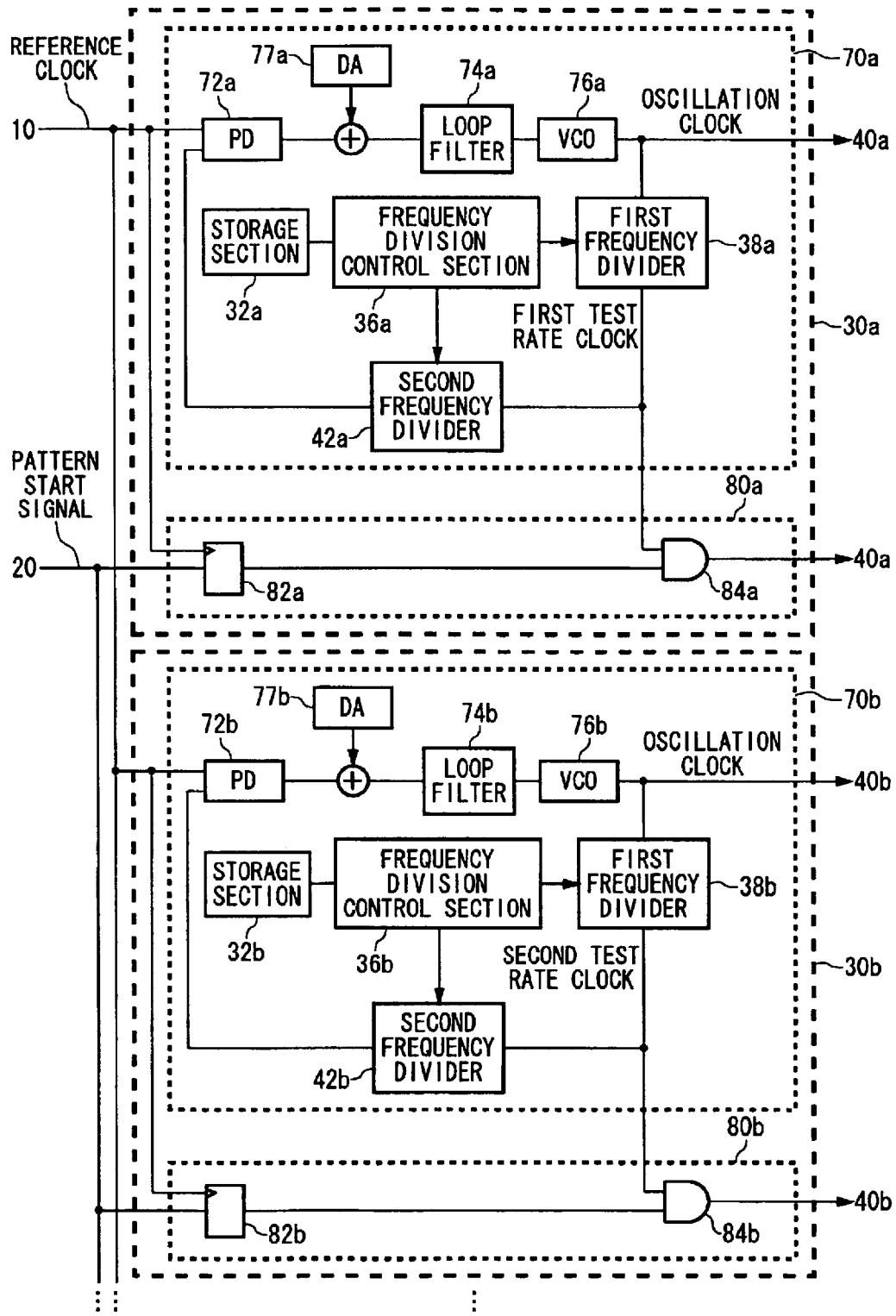
FIG. 2 shows an example of the configuration of a plurality of test rate generating sections 30.

FIG. 2 shows an example of the configuration of the plurality of test rate generating sections 30. Each of the plurality of test rate generating sections 30 has the same function and configuration. In this embodiment, the configurations of the first and second test rate generating sections 30*a* and 30*b* will be described. Each of the first and second test rate generating sections 30*a* and 30*b* includes an oscillator section 70, a first frequency divider 38, a second frequency divider 42, a switching section 80, a frequency division control section 36, and a storage section 32.

The oscillator section 70*a* receives the reference clock from the reference clock generating section 10 and generates an oscillation clock whose frequency is an approximately integral multiple of the frequency of the reference clock. Each of the oscillator sections 70 synchronizes the phases of the oscillation clocks and the test rate clocks based on the phases of a verifying clock and the reference clock. In this embodiment, each of the oscillator sections 70 is a phase lock loop (PLL).

The first frequency dividers 38 divide the frequency of the oscillation clocks with desired ratios of frequency division and generate the test rate clocks. In other words, the first frequency divider 38*a* of the first test rate generating section 30*a* generates the first test rate clock, and the first frequency divider 38*b* of the second test rate generating section 30*b* generates the second test rate clock.

Each of the second frequency dividers 42 divides the frequency of the corresponding test rate clock and generates a verifying clock whose frequency is approximately the same as the frequency of the reference clock. In other words, the second frequency divider 42*a* of the first test rate generating section 30*a* divides the frequency of the first test rate clock and generates its verifying clock whose frequency is approximately the same as the frequency of the reference clock, and the second frequency divider 42*b* of the second test rate generating section 30*b* divides the frequency of the second test rate clock and generates its verifying clock whose frequency is approximately the same as the frequency of the reference clock.

Each of the oscillator sections 70 includes a phase detector 72, a loop filter 74, a DA 77, and a voltage controlled oscillator 76. The voltage controlled oscillator 76 generates an oscillation clock of a desired frequency. Each of the phase detectors 72 detects the phases of the reference clock and the verifying clock. Each of the loop filters 74 controls the oscillation frequency of the oscillation clock generated by the voltage controlled oscillator 76 based on the difference between the phases of the reference clock and the verifying clock detected by the phase detector 74 in order that the difference decreases.

In addition, the DAs 77 provide offsets to correct the skew of the test rate clocks due to the deviation of products. For example, the DAs 77*a* and 77*b* delay the signals outputted by the phase detectors 72 as much as predetermined time intervals and correct the skew between the first and second test rate clocks.

Each of the oscillator sections 70 synchronizes the phases of the reference clock, its oscillation clock and test rate clock by synchronizing the phases of the reference clock and its verifying clock. Since the reference clock and the verifying clock have approximately the same frequency, it is possible to synchronize the phases the reference clock and the verifying clock with high precision. Accordingly, each of the oscillator section 70 can high precisely generate its oscillation clock and test rate clock which are synchronized with the reference clock. And since each of the oscillator sections 70 synchronizes its test rate clock with the reference clock, so that the test rate clocks generated by the oscillator sections 70 can be synchronized with each other. In other words, the plurality of oscillator sections 70 can generate the plurality of test rate clocks of different frequencies whose phases are synchronized at predetermined timing. And although the reference clock and each of the test rate clocks are synchronized by means of the loop filters 74 in this embodiment, alternatively they may be synchronized by other means.

And the frequency division control sections 36 control the ratios of frequency division of the first and second corresponding frequency dividers 38 and 42. Each of the frequency division control sections 36 controls the ratios of frequency division of the first and second corresponding frequency dividers 38 and 42 based on the frequency of the test rate clock to be generated by the corresponding test rate generating section 30 and the frequency of the corresponding oscillation clock.

As the frequency division control sections 36 control the ratios of frequency division of the first frequency dividers 38, it is possible to generate the test rate clocks of desired frequencies from the oscillation clocks of desired frequencies. And as the frequency division control sections 36 control the ratios of frequency division of the second frequency dividers 42, it is possible to generate the verifying clock whose frequency is approximately the same as the frequency of the reference clock and the oscillation clock of a desired frequency.

For example, if the jitter of the oscillator sections 70 is desired to be small, the frequency of the oscillation clock may be low. And if the variable error of a fine delay section 92 to be described later is desired to be small, the frequency of the oscillator sections 70 may be high. The frequency division control sections 36 control the ratios of frequency division of the first and second frequency dividers 38 and 42 based on the frequency of the oscillation clock. The tester 100 may be further provided with an instruction section for receiving from a user an instruction on whether to make the jitter of the oscillator sections small or the variable error of the fine delay sections 92 small, and the frequency division control sections 36 may control the first and/or second frequency divider(s) 38 and/or 42 respectively.

And each of the storage sections 32 correspondingly stores a table of the frequency of the test rate to be generated by the corresponding test rate generating section 30, the frequency of the corresponding oscillation clock and the ratios of frequency division of the first and second frequency dividers 38 and 42 to be controlled by the corresponding frequency division control section 36. For example, the tester 100 may be further provided with an instruction section for receiving from outside the information on the frequency of the test rate to be generated by each of the test rate generating sections 30 and the frequency of the oscillation clock. Each of the frequency division control sections 36 refers to the table stored in the storage section 32 based on the information received by the instruction section and controls the ratios of frequency division of the first and second frequency dividers 38 and 42. And the frequency of the oscillation clock may be predetermined.

Each of the switching sections 80 switches whether to supply the corresponding driver section 40 (see FIG. 1) with the test rate clock generated by the corresponding test rate generating section 30 based on the reference clock and the pattern start signal. Each of the switching sections 80 supplies the corresponding driver section 40 with the corresponding test rate clock, if the reference clock and the pattern start signal indicate a predetermined value. In this embodiment, each of the switching sections 80 includes a flip-flop 82 and an AND circuit 84. The flip-flop 82 is a D-FF that receives the reference clock and the pattern start signal and outputs the pattern start signal when the reference clock indicates a predetermined value. The AND circuit 84 supplies the corresponding driver section 40 with the corresponding test rate clock, if the output of the flip-flop 82 indicates H logic.

As each of the switching sections 80 switches whether to supply the corresponding driver section 40 with the corresponding test rate clock based on the pattern start signal and the reference clock, it is possible to synchronize the timing at which the each of the driver sections 40 starts to supply the test pattern to the electronic device 60. And although it is the configurations of the first and second test rate generating sections 30a and 30b that have been described above in this embodiment, other test rate generating sections 30 also have the same function and configuration. In other words, according to the tester 100 related to this embodiment, it is possible to generate a plurality of test rate clocks whose phases are synchronized with each other and frequencies are different from each other. Accordingly, it is possible to synchronize the phases of a plurality of test patterns of different frequencies and supply them to the electronic device 60.

Figure 3:
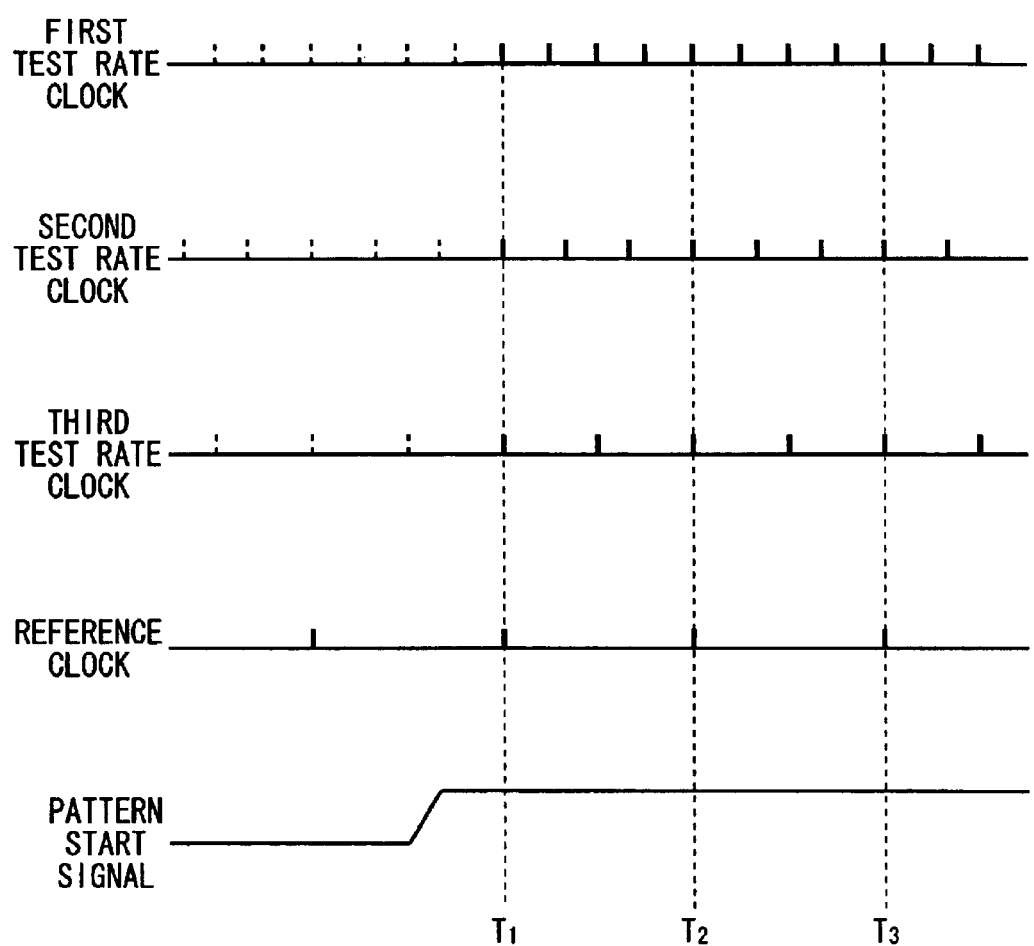
FIG. 3 shows a timing chart of an example of a plurality of test rate clocks generated by the plurality of test rate generating sections 30.

FIG. 3 shows a timing chart of an example of the plurality of test rate clocks generated by the plurality of test rate generating sections 30. In FIG. 3, the horizontal axis shows the time axis. The reference clock generating section 10 (see FIG. 1) generates the reference clock whose period is approximately the same as the least common multiple of the periods of the plurality of test rate clocks to be respectively generated by the test rate generating sections 30. Here, the period equal to the least common multiple is the minimum period which can be just divided by the period of every test rate, and the periods of the reference clock and the test clocks may be represented by decimals. In this embodiment, the frequencies of the reference clock and the first, second and third test rate clocks are assumed to be 1 MHz, 4 MHz, 3 MHz and 2 MHz respectively.

As described in FIG. 2, the first, second and third test rate clocks are synchronized with the reference clock as shown in FIG. 3. Although the plurality of test rate clocks are synchronized at the timing (T1, T2 and T3) of the reference clock in this embodiment, alternatively, they may be synchronized at the timing later than the timing of the pulse of the reference clock by a desired offset time. For example, each of the test rate generating sections 30 described in connection with FIG. 2 may be provided with a delay circuit for delaying the test rate by the desired offset time.

The plurality of test rate generating sections 30 start to supply the test rate clocks to the corresponding driver sections 40 (see FIG. 1) at the timing (T1) when the pattern start signal and the reference clock indicate the H logic. The driver sections 40 supply the test patterns in response to the pluses of the test rate clocks. In this embodiment, the driver sections 40 format the signals resulting from delaying the pulses of the test rate clocks by a desired time interval and supply them to the electronic device 60 as the test patterns.

And the pattern start signal generating section 20 generates the pattern start signal whose value changes into the H logic based on the timing when one cycle of the test patterns starts or the L logic based on the timing when the test pattern is finished. Since the reference clock generating section 10 generates the reference clock whose period is approximately the same as the least common multiple of the periods of the plurality of test rate clocks, it is possible to start the next cycle of the test patterns with high efficiency even if the cycles of the test patterns are continuously performed. In other words, it is possible to start to supply the next cycle of the test patterns at the timing when the plurality of test rate clocks are synchronized right after the timing when the present cycle is finished.

Figure 4:
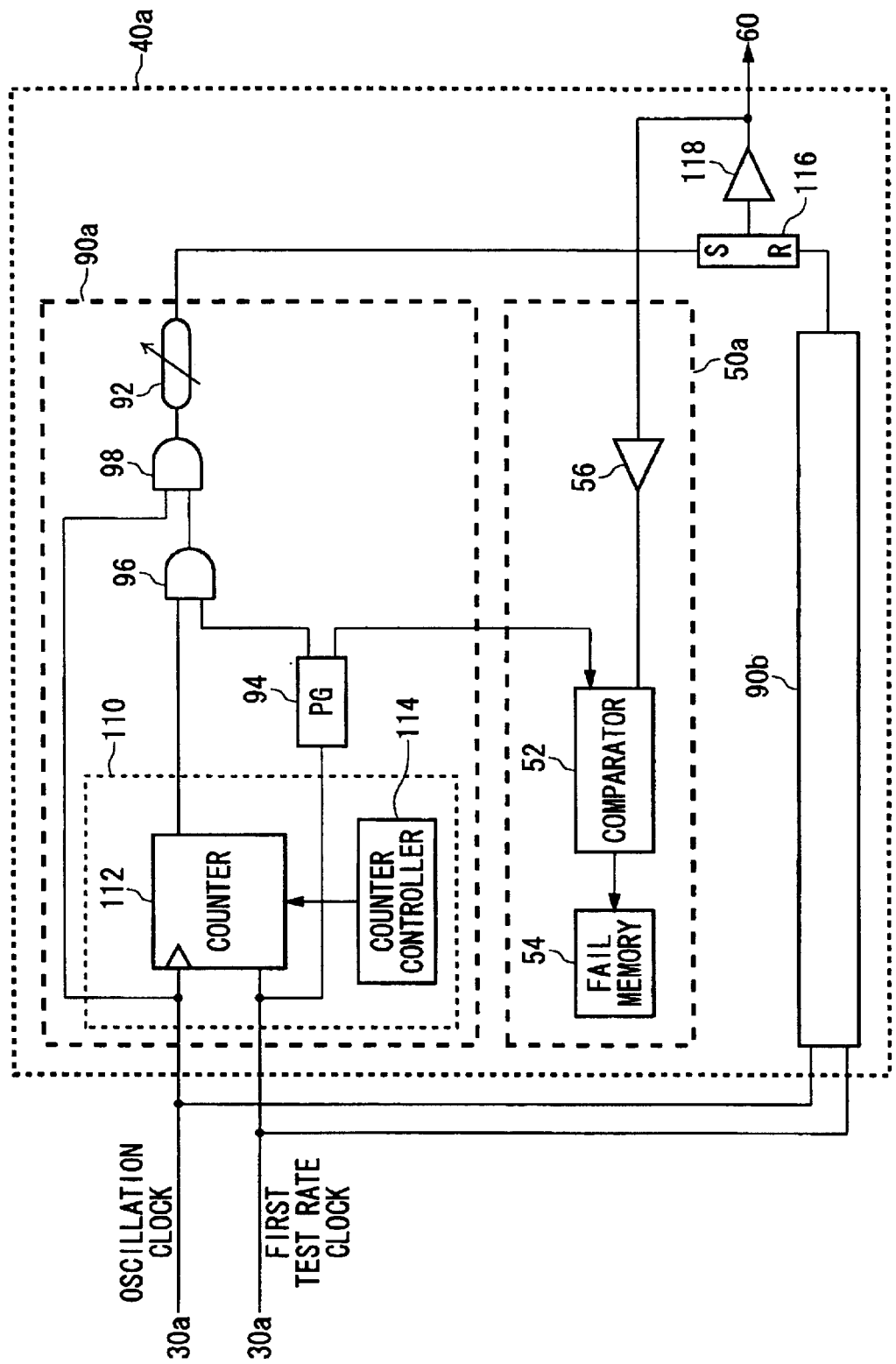
FIG. 4 shows an example of the configuration of a driver section 40.

FIG. 4 shows an example of the configuration of one of the driver sections 40. The configuration of the first driver section 40a is shown in FIG. 4. Other driver sections 40 have the same function and configuration as those of the first driver section 40a. Each of the driver sections 40 includes a set-side generating section 90a, a reset-side generating section 90b, a set-reset latch 116, a judgment section 50 and a driver 118.

The set-side generating section 90a generates the timing of the rising edge of the waveform of the test pattern, and the reset-side generating section 90b generates the timing of the falling edge of the waveform of the test pattern. The set-side and reset-side generating sections 90a and 90b have the same function and configuration.

The set-reset latch 116 generates the test pattern whose value changes into the H logic at the timing generated by the set-side generating section 90a and the L logic at the timing generated by the reset-side generating section 90b. The driver 118 supplies the electronic device 60 with the test pattern generated by the set-reset latch 116.

The set-side generating section 90a includes a coarse delay section 110, a pattern generator 94, AND circuits (96 and 98), and a fine delay section 92. The coarse delay section 110 generates a timing signal which results from delaying each of the pulses of the corresponding test rate clock as much as a desired integral multiple of the period of the corresponding oscillation clock. The pattern generator 94 generates a pulse, which indicates the rising edge of the corresponding test pattern, in response to the test rate clock. The AND circuits 96 and 98 format the pulse into a bust signal. The fine delay section 92 delays a pulse indicating the falling edge of the test pattern by a desired time interval and supplies it to the set-reset latch 116.

The coarse delay section 110 includes a counter 112 and a counter control section 114. The counter 112 counts the number of the pulses of the oscillation clocks taking the test rate clocks as triggers and outputs a predetermined pulse when counting a desired number of pulses. The counter control section 114 controls the number of pulses to be counted by the counter 112. As the counter control section 114 controls the number of pulses to be counted by the counter 112, it is possible to delay the pulses of the test rate clock by a desired integral multiple of the period of the oscillation clock and generate pulses.

The fine delay section 92 delays the pulses generated by the AND circuit 98 as much as a desired time interval smaller than the period of the oscillation clock. The fine delay section 92 includes a variable delay circuit and a linearization memory for storing a table to control the delay amount of the variable delay circuit. Since the fine delay section 92 generates the delay of a desired time smaller than the period of the oscillation clock, it is possible to make the capacity of the linearization memory small by setting the frequency of the oscillation clock to be high in advance. According to this embodiment, it is possible to generate the test pattern of a desired phase.

The judgment section 50 judges the quality of the electronic device 60 based on the output signal by the electronic device 60 in response to the test pattern. The judgment section 50 includes a comparator 56, a comparator 52, and a fail memory 54.

The comparator 56 supplies the comparator 52 with a signal indicating whether the output signal is larger than a predetermined value or not in the form of a digital signal. The comparator 52 compares the digital signal received from the comparator 56 with an expected signal received from the pattern generator 94 and judges the quality of the corresponding core of the electronic device 60. The fail memory 54 stores the judgment result of the comparator 52.

Figure 5:
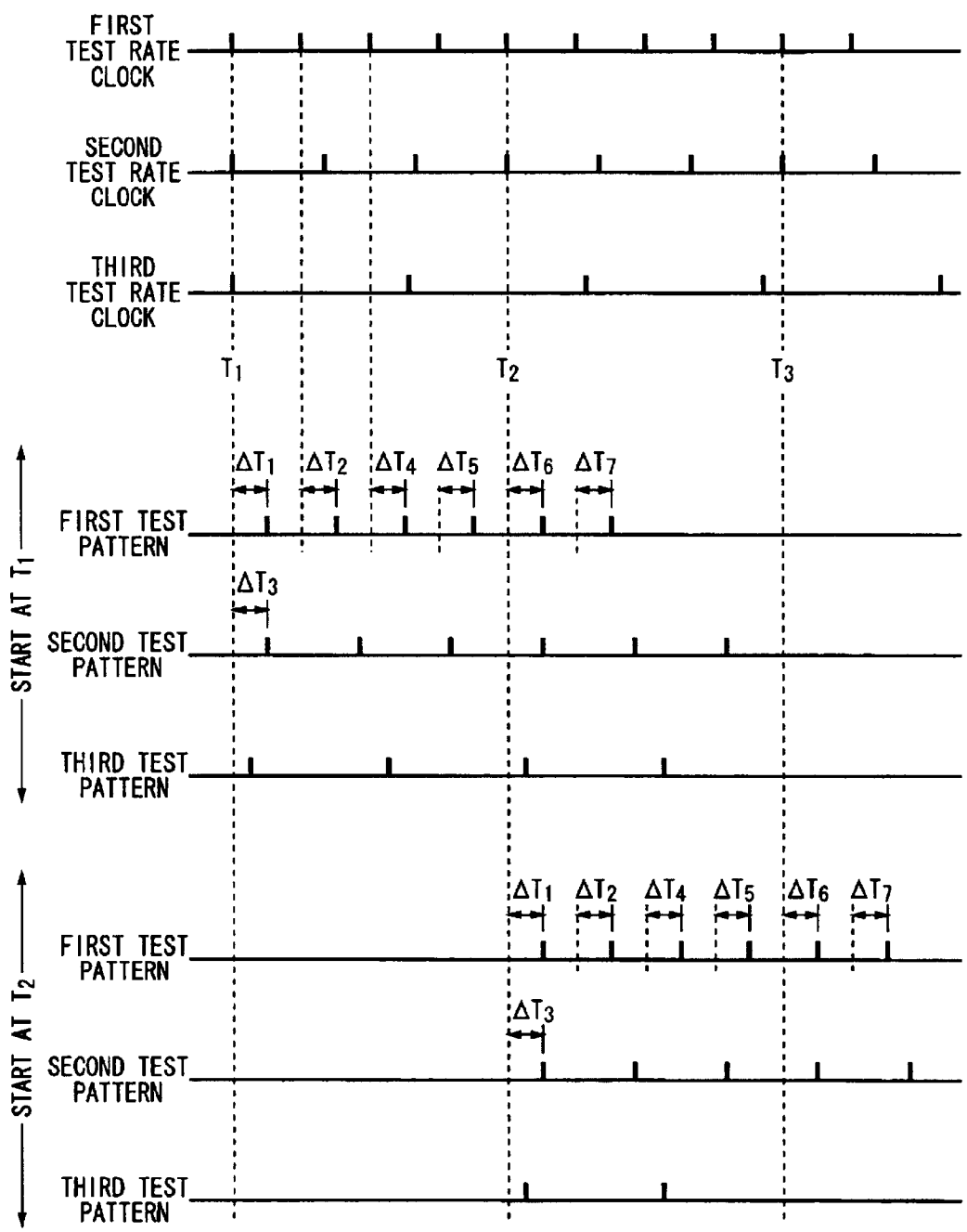
FIG. 5 shows a timing chart of an example of a plurality of test patterns generated by the plurality of driver sections 40.

FIG. 5 shows a timing chart of an example of the plurality of test patterns generated by the plurality of driver sections 40. The horizontal axis represents the time axis in FIG. 5. And the test rate clocks shown in FIG. 5 have the same phases as the test rate clocks in FIG. 3.

Each of the driver sections 40 generates the test pattern having the pulses resulting from delaying the pulses of the corresponding test rate clock by desired time intervals. For example, as shown in FIG. 5, the first driver section 40a generates its test pattern having the pulses which result from delaying the pulses of the first test rate clock by ΔT1 and ΔT2 respectively. Since the plurality of test rate clocks are synchronized at predetermined timing, the plurality of test patterns are synchronized at predetermined timing.

And as the test cycle starts at the timing when the plurality of test rate clocks as shown by T1, T2, . . . in FIG. 5 are synchronized, it is possible to synchronize the plurality of test patterns in each of the test cycles and supply them to the electronic device 60. For example, as the test pattern of 1 cycle starts at the timing represented by T1 in each of the driver sections 40 and the test pattern of +1 cycle starts at the timing (the frequency of the test rate clock [Hz]/the frequency of the reference clock [Hz]) represented by T2, it is possible to synchronize the test pattern in each of the test cycles. The tester 100 controls the timing at which each of the test cycles starts by the pattern start signal generated by the pattern start signal generating section 20 (see FIG. 1).

And the phase relation of the plurality of test patterns when the supply of the test patterns starts at the timing T1 and the phase relation of the plurality of test patterns when the supply of the test patterns starts at the timing T2 are approximately the same as shown in FIG. 5. Accordingly, even if the supply of the test patterns starts at certain timing, it is possible to perform the test with reproducibility.

Figure 6:
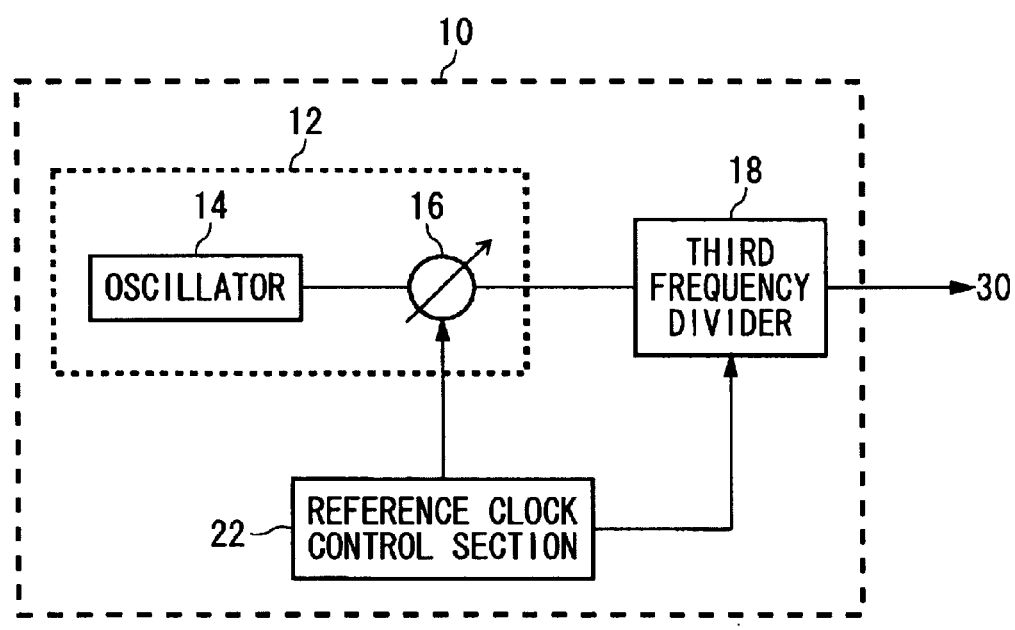
FIG. 6 shows an example of the configuration of a reference clock generating section 10.

FIG. 6 shows an example of the configuration of the reference clock generating section 10. The reference clock generating section 10 includes a variable oscillator section 12, a third frequency divider 18, and a reference clock control section 22.

The variable oscillator section 12 generates a variable frequency clock with a variable octave frequency range. For example, the variable oscillator section 12 generates the variable frequency clock with the variable frequency range of 10 MHz to 20 MHz.

The third frequency divider 18 divides the frequency of the variable frequency clock with the ratio of frequency division and generates the reference clock of a desired frequency. The third frequency divider 18 generates the reference clock whose period is the least common multiple of the periods of the test rate clocks described above.

For example, if the third frequency divider 18 can perform the frequency division with the ratio of 1, 2, . . . , 6 and the variable oscillator section 12 generates the variable frequency clock with the variable frequency range of 10 MHz to 20 MHz, the reference clock generating section 10 can generate the reference clock of an arbitrary frequency between 1.66 MHz to 20 MHz. The reference clock control section 22 controls the oscillation clock of the variable oscillator section 12 and the ratio of frequency division of the third frequency divider 18 based on the frequency of the reference clock to be generated.

And the variable oscillator section 12 includes an oscillator 14 and an octave variable device 16. The oscillator 14 generates a clock of a predetermined frequency. The octave variable device 16 generates the variable frequency clock of the octave frequency based on the clock generated by the oscillator 14.

Figure 7:
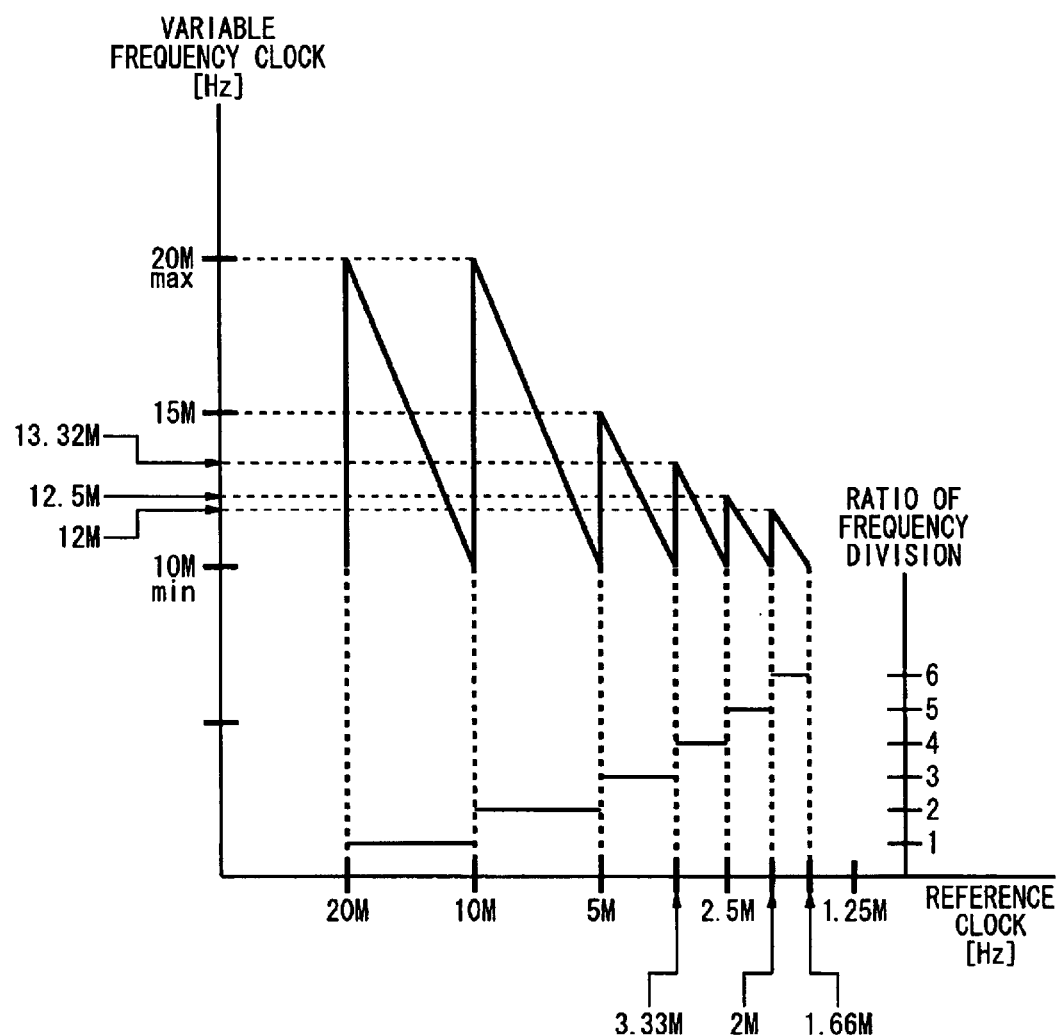
FIG. 7 shows an example of the control method of a reference clock control section 22.

FIG. 7 shows an example of the control method of the reference clock control section 22. The vertical axis on the left in FIG. 7 represents the frequency of the variable frequency clock, the horizontal axis represents the frequency of the reference clock, and the vertical axis on the right represents the ratio of frequency division of the third frequency divider 18. In this embodiment, the variable frequency clock has a variable frequency area of 10 MHz to 20 MHz, and the ratio of frequency division of 1, 2, 3, . . . can be set in the third frequency divider 18.

The reference clock control section 22 sets the ratio of frequency division of the third frequency divider 18 based on the frequency of the reference clock. For example, if reference clock of 8 MHz is generated, as shown in FIG. 7, the reference clock control section 22 sets the ratio of frequency division of the third frequency divider 18 to be 2. The reference clock control section 22 may set the ratio of frequency division of the third frequency divider 18 based on the following equation:

$$M = int\left(\frac{f0_{min}}{f_{ref}} + 1\right).$$

Where, M represents the ratio of frequency division of the third frequency divider 18, $f0_{min}$ represents the lower limit value of the variable frequency clock (10 MHz in this embodiment), and $f_{ref}$ represents the frequency of the reference clock to be generated.

Next, the reference clock control section 22 controls the frequency of the variable frequency clock to be generated by the variable oscillator section 12 based on the ratio of frequency division, which has been set, and the frequency of the reference clock. For example, if the reference clock of 8 MHz is generated, as shown in FIG. 7, the reference clock control unit 22 controls the frequency of the variable frequency clock to be generated by the variable oscillator section 12 to be 16 MHz. The reference clock control section 22 may control the frequency of the variable frequency clock to be generated by the variable oscillator section 12 based on the following equation:

$$f0 = f_{ref} \times M.$$

Where, $f_0$ represents the frequency of the variable frequency clock.

Figure 8:
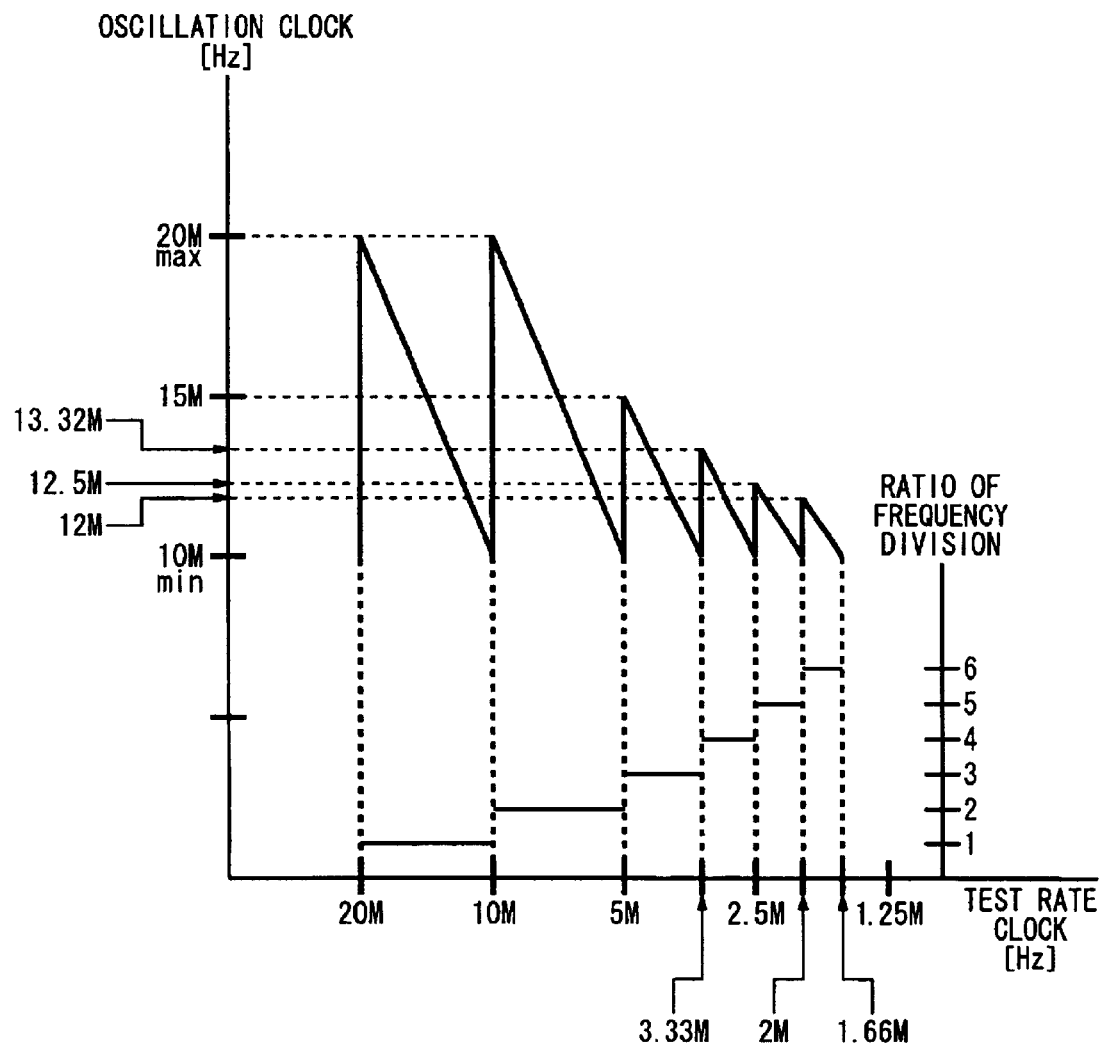
FIG. 8 shows an example of the control method of a frequency division control section 36.

FIG. 8 shows an example of the control method of the frequency division control section 36. The vertical axis on the left in FIG. 8 represents the frequency of the oscillation clock, the horizontal axis represents the frequency of the test rate clock, and the vertical axis on the right represents the ratio of frequency division of the first frequency divider 38. In this embodiment, the oscillation clock has a variable frequency area of 10 MHz to 20 MHz, and the ratio of frequency division of 1, 2, 3, . . . can be set in the first frequency divider 38.

The frequency division control section 36 sets the ratio of frequency division of the first frequency divider 38 based on the frequency of the test rate clock to be generated. For example, if the test rate clock of 3 MHz is generated, as shown in FIG. 8, the frequency division control section 36 sets the ratio of frequency division of the first frequency divider 38 to be 4. The frequency division control section 36 may set the ratio of frequency division of the first frequency divider 38 based on the following equation:

$$La = int\left(\frac{f1_{min}}{f_{rate}} + 1\right).$$

Where, La represents the ratio of frequency division of the first frequency divider 38, $f1_{min}$ represents the lower limit of the oscillation clock (10 MHz in this embodiment), and $f_{rate}$ represents the frequency of the test rate clock to be generated.

And the oscillator section 70 generates the oscillating clock of a frequency based on the ratio of frequency division set by the frequency control section 36 and the frequency of the test rate clock. For example, if the test rate clock of 3 MHz is generated, as shown in FIG. 8, the oscillator section 70 generates the oscillation clock whose frequency is 12 MHz. The oscillator section 70 may generate the oscillation clock of a frequency based on the following equation:

$$f1 = f_{rate} \times La.$$

Where, f1 represents the frequency of the oscillation clock.

Figure 9:
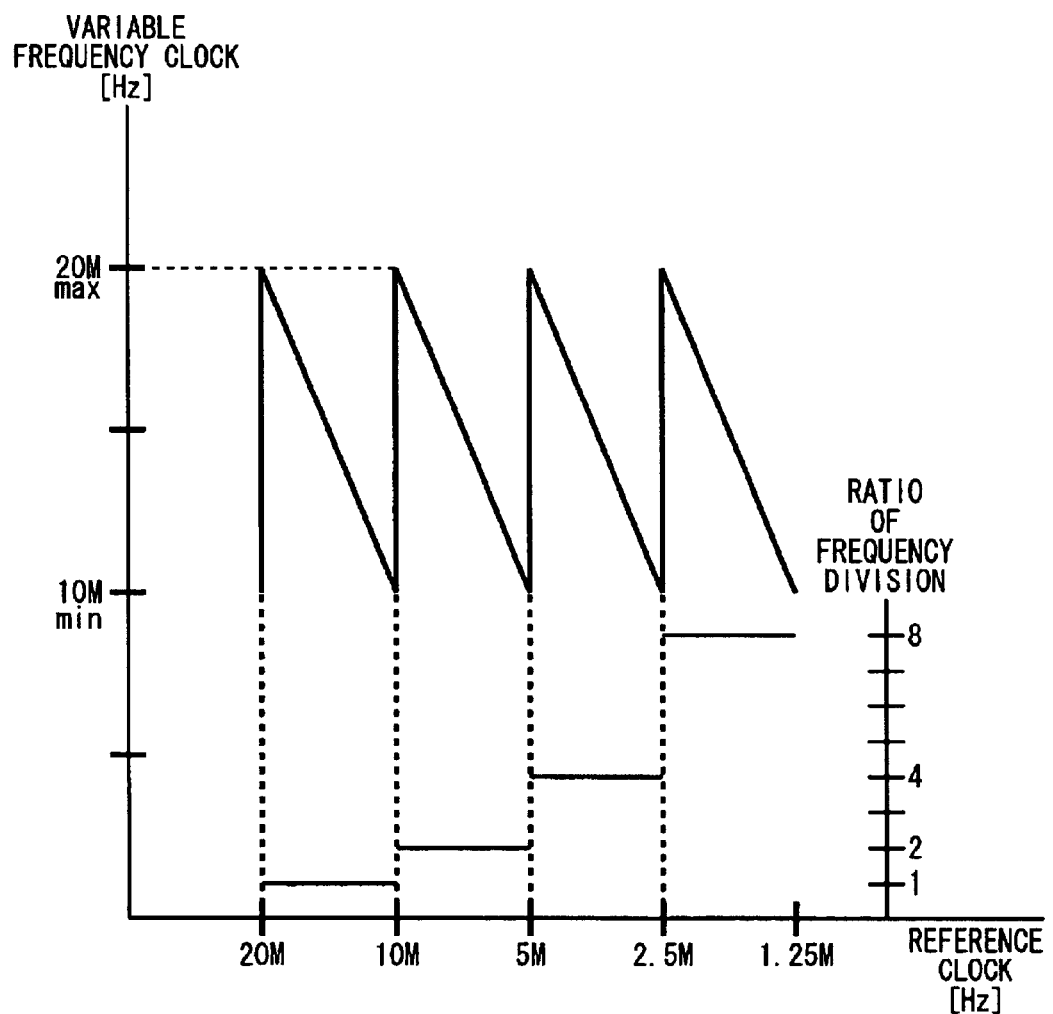
FIG. 9 shows another example of the control method of the reference clock control section 22.

FIG. 9 shows another example of the control method of the reference clock control section 22. The vertical axis on the left in FIG. 9 represents the frequency of the variable frequency clock, the horizontal axis represents the frequency of the reference clock, and the vertical axis on the right represents the ratio of frequency division of the third frequency divider 18. In this embodiment, the variable frequency clock has a variable frequency area of 10 MHz to 20 MHz, and the ratio of frequency division of 1, 2, 4, . . . , 8, . . . , 2m can be set in the third frequency divider 18.

Also in this embodiment, the reference clock control section 22 performs the same control as the reference clock control section 22 described in connection with FIG. 7. In this embodiment, the reference clock control section 22 sets the ratio of frequency division of the third frequency divider 18 based on the following equations:

$$M = 2m,$$

$$m = int\left(\frac{\log e\left(\frac{f0_{min}}{f_{ref}}\right)}{\log e 2} + 1\right).$$

Where, M represents the ratio of frequency division of the third frequency divider 18, $f0_{min}$ represents the lower limit of the variable frequency clock (10 MHz in this embodiment), and $f_{ref}$ represents the frequency of the reference clock to be generated.

And the reference clock control section 22 may control the frequency of the variable frequency clock to be generated by the variable oscillator section 12 based on the following equation:

$$f0 = f_{ref} \times 2^m.$$

Where, $f_0$ represents the frequency of the variable frequency clock. According to this embodiment, it is possible to realize the simplification of a circuit.

Figure 10:
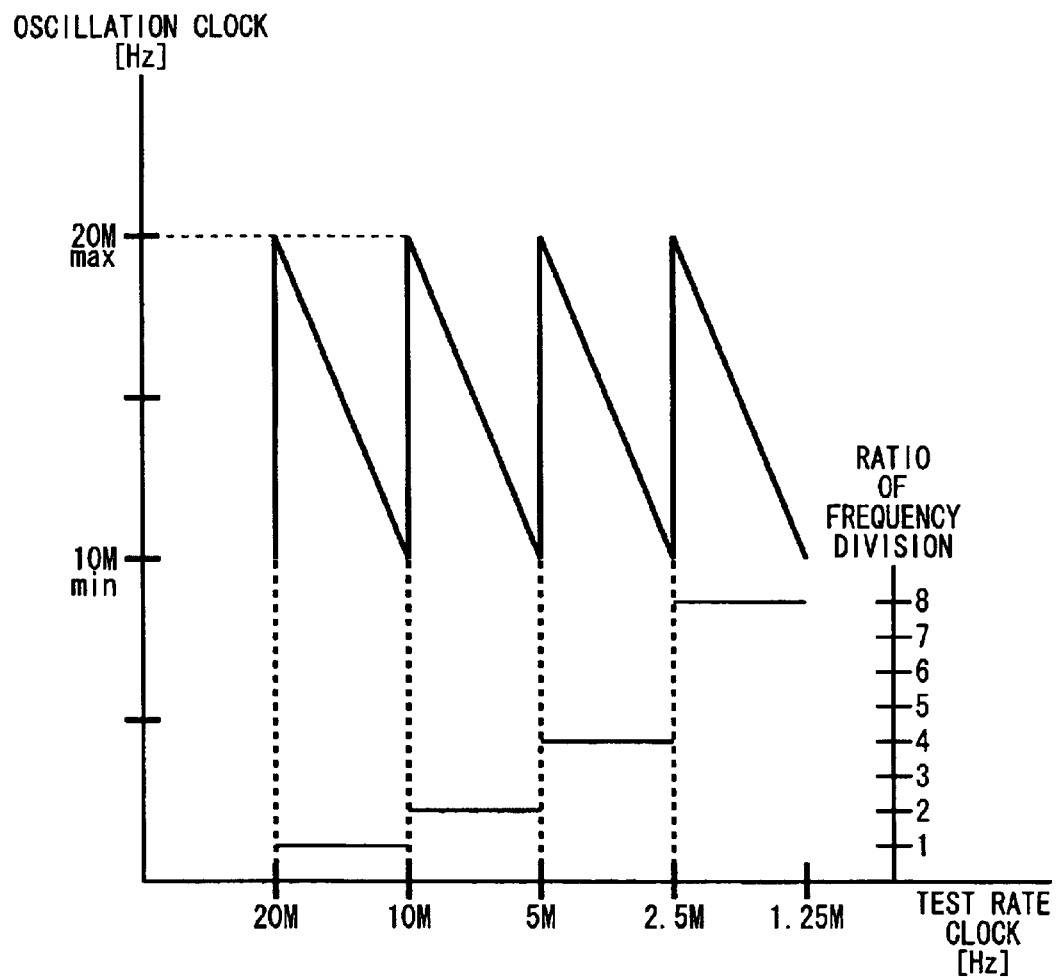
FIG. 10 shows another example of the control method of the frequency division control section 36.

FIG. 10 shows another example of the control method of the frequency division control section 36. The vertical axis on the left in FIG. 10 represents the frequency of the oscillation clock, the horizontal axis represents the frequency of the test rate clock, and the vertical axis on the right represents the ratio of frequency division of the first frequency divider 38. In this embodiment, the oscillation clock has a variable frequency area of 10 MHz to 20 MHz, and the ratio of frequency division of 1, 2, 3, . . . can be set in the first frequency divider 38.

Also in this embodiment, the frequency division control section 36 performs the same control as the frequency division control section 36 described in connection with FIG. 8. In this embodiment, the frequency division control section 36 sets the ratio of frequency division La of the first frequency divider 38 based on the following equation:

$$La = 2L.$$

Where, L is represented by the following equation:

$$L = int\left(\frac{\log e\left(\frac{f1_{min}}{f_{rate}}\right)}{\log e 2} + 1\right).$$

Where, $f1_{min}$ represents the lower limit of the oscillation clock (10 MHz in this embodiment), and $f_{rate}$ represents the frequency of the test rate clock to be generated.

Also in this embodiment, the oscillator section 70 performs the same control as the oscillator section 70 described in connection with FIG. 8. In this embodiment, the oscillator section 70 generates the oscillation section of a frequency based on the following equation:

$$f1 = f_{rate} \times 2^L.$$

Where, f1 represents the frequency of the oscillation clock. According to this embodiment, it is possible to realize the simplification of a circuit.

Figure 11:
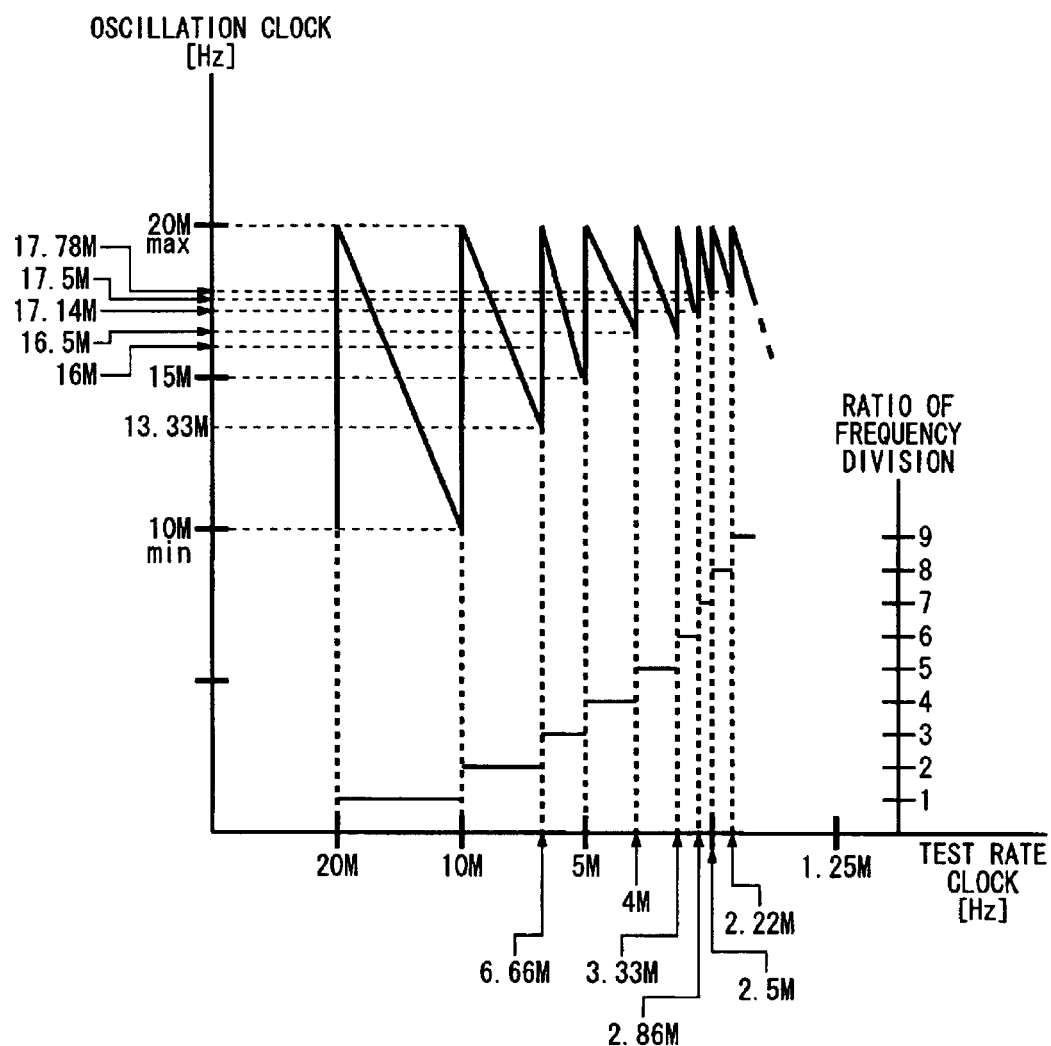
FIG. 11 shows further another example of the control method of the frequency division control section 36.

FIG. 11 shows further another example of the control method of the frequency division control section 36. The vertical axis on the left in FIG. 11 represents the frequency of the oscillation clock, the horizontal axis represents the frequency of the test rate clock, and the vertical axis on the right represents the ratio of frequency division of the first frequency divider 38. In this embodiment, the oscillation clock has a variable frequency area of 10 MHz to 20 MHz, and the ratio of frequency division of 1, 2, 3, . . . can be set in the first frequency divider 38.

Also in this embodiment, the frequency division control section 36 performs the same control as the frequency division control section 36 described in connection with FIG. 8. In this embodiment, the frequency division control section 36 sets the ratio of frequency division of the first frequency divider 38 based on the following equation:

$$La = int\left(\frac{f1_{max}}{f_{rate}}\right).$$

Where, La represents the ratio of frequency division of the first frequency divider 38, $f1_{max}$ represents the upper limit of the oscillation clock (20 MHz in this embodiment), and $f_{rate}$ represents the frequency of the test rate clock to be generated.

Also in this embodiment, the oscillator section 70 performs the same control as the oscillator section 70 described in connection with FIG. 8. In this embodiment, the oscillator section 70 generates the oscillation section of a frequency based on the following equation:

$$f1 = f_{rate} \times La.$$

Where, f1 represents the frequency of the oscillation clock.

In the embodiment described in connection with FIG. 8, since the ratio of the first frequency divider 38 and the frequency of the oscillation clock are set to be low, it is possible to make the jitter of the oscillator section 70 described above small. And in the embodiment described in connection with FIG. 11, since the ratio of the first frequency divider 38 and the frequency of the oscillation clock are set to be high, it is possible to make the variable delay error of the fine delay section 92 described above small.

Although the present invention has been described by way of exemplary embodiments, it should be understood that those skilled in the art might make many changes and substitutions without departing from the spirit and the scope of the present invention, which is defined only by the appended claims.

As obvious from the description above, according to the present invention, it is possible to highly precisely test an electronic device with a plurality of cores whose operating frequencies are different.

What is claimed is:

1. A tester for testing an electronic device, comprising:
a reference clock generating section for generating a reference clock of a first frequency;
a first test rate generating section for generating a first test rate clock, whose frequency is a substantially integral multiple of said first frequency, based on said reference clock;
a second test rate generating section for generating a second test rate clock, whose frequency is a substantially integral multiple of said first frequency and different from said frequency of said first test rate clock, based on said reference clock;
a first driver section for supplying said electronic device with a first test pattern of a second frequency to test said electronic device according to said first test rate clock; and
a second driver section for supplying said electronic device with a second test pattern of a third frequency to test said electronic device according to said second test rate clock.

2. A tester as claimed in claim 1, wherein said first and second driver sections start to supply said electronic device with said first and second test patterns, synchronizing said first and second test patterns at desired timing.

3. A tester as claimed in claim 2, wherein each of first and second driver sections supplies said electronic device with said first or second corresponding test pattern at a frequency substantially the same as said frequency of said first or second test rate clock.

4. A tester as claimed in claim 3, wherein said reference clock generating section generates said reference clock whose period is substantially the same as a least common multiple of periods of said first and second test rate clocks to be generated by said first and second test rate generating sections.

5. A tester as claimed in claim 4, further comprising:
a pattern start signal generating section for generating a pattern start signal which indicates said desired timing,
wherein said first and second driver sections start to supply said first and second test patterns based on said pattern start signal.

6. A tester as claimed in claim 5,
wherein each of said first and second test rate generating sections comprises:
an oscillator section for receiving said reference clock and generating an oscillation clock whose frequency is substantially integral multiple of said frequency of said reference clock;
a first frequency divider for dividing said frequency of said oscillation clock and generating said first or second test rate clock; and
a second frequency divider for dividing said frequency of said first or second test rate clock and generating a verifying clock whose frequency is substantially the same as said frequency of said reference clock,
wherein each of said oscillator sections synchronizes a phase of each of said oscillation clocks based on a phase of each of said verifying clocks and a phase of said reference clock.

7. A tester as claimed in claim 6,
wherein each of said first and second test rate generating sections further comprises a frequency division control section for controlling a ratio of frequency division of said first corresponding frequency divider, and
each of said frequency division control sections controls said ratio of frequency division of said first corresponding frequency divider based on said frequency of said first or second test rate clock to be generated by said first or second corresponding test rate generating section and said frequency of said corresponding oscillation clock.

8. A tester as claimed in claim 7, further comprising:
a storage section for correspondingly storing said frequency of said first or second test rate clock to be generated by said first or second test rate generating section, said frequency of said oscillation clock, and said ratio of frequency division of said first frequency divider to be controlled by said first frequency division control section.

9. A tester as claimed in claim 8,
wherein each of said first and second test rate generating sections further comprises a switching section for switching whether to supply said first or second corresponding driver section with said first or second corresponding test rate clock based on said reference clock and pattern start signal.

10. A tester as claimed in claim 9,
wherein said switching section supplies said first or second corresponding driver section with said first or second corresponding test rate clock, if each of said reference clock and pattern start signal indicates a predetermined value.

11. A tester as claimed in claim 10,
wherein each of said first and second driver sections comprises:

a coarse delay section for generating a timing signal, which results from delaying each of pulses of said first or second corresponding test rate clock as much as a desired integral multiple of a period of a corresponding oscillation clock;

a pattern generator for generating said first or second corresponding test pattern according to said timing signal; and a fine delay section for delaying said corresponding first or second test pattern for predetermined time intervals and supplying said test pattern to said electronic device.

12. A tester as claimed in claim 11, wherein said reference clock generating section comprises:

a variable oscillator section for generating a variable frequency clock with a variable octave frequency range; and a third frequency divider for dividing a frequency of said variable frequency clock at a desired ratio of frequency division and generating said reference clock of a desired frequency.

* * * * *